United States Patent
Tateno et al.

(10) Patent No.: US 7,342,391 B2
(45) Date of Patent: *Mar. 11, 2008

(54) POWER SUPPLY DEVICE AND SWITCHING POWER SUPPLY DEVICE

(75) Inventors: Koji Tateno, Takasaki (JP); Ryotaro Kudo, Takasaki (JP); Shin Chiba, Takasaki (JP); Kyoichi Hosokawa, Takasaki (JP); Toshio Nagasawa, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/808,286

(22) Filed: Jun. 8, 2007

(65) Prior Publication Data

US 2007/0236204 A1 Oct. 11, 2007

Related U.S. Application Data

(63) Continuation of application No. 11/100,407, filed on Apr. 7, 2005, now Pat. No. 7,245,116.

(30) Foreign Application Priority Data

Apr. 14, 2004 (JP) ............................. 2004-118541

(51) Int. Cl.
    G05F 3/16 (2006.01)
(52) U.S. Cl. ..................... 323/316; 323/314; 324/158.1
(58) Field of Classification Search ............... 323/222, 323/268, 282–288, 314, 316; 327/545, 577, 327/581, 108, 362, 327; 324/158.1
    See application file for complete search history.

(56) References Cited

U.S. PATENT DOCUMENTS

| 4,013,938 A | * | 3/1977 | McCoy .................... 363/56.01 |
| 4,553,084 A | | 11/1985 | Wrathall |
| 5,982,160 A | | 11/1999 | Walters et al. |
| 6,462,525 B1 | * | 10/2002 | Chen .......................... 323/285 |
| 6,534,960 B1 | | 3/2003 | Wells et al. |
| 6,563,294 B2 | * | 5/2003 | Duffy et al. ................ 323/283 |
| 6,803,752 B1 | * | 10/2004 | Chen .......................... 323/282 |

FOREIGN PATENT DOCUMENTS

| JP | 06-180332 | 6/1994 |
| JP | 2004-93188 | 3/2004 |

* cited by examiner

*Primary Examiner*—Rajnikant B. Patel
(74) *Attorney, Agent, or Firm*—Mattingly, Stanger, Malur & Brundidge, P.C.

(57) ABSTRACT

In a driver circuit constructing a switching power supply device that switches power transistors passing a current through a coil by a PWM mode, a current detection transistor, which is smaller in size than the low-potential side power transistor, and a current detection resistor are provided in parallel to the low-potential side power transistor. The same control voltage as the power transistor is applied to the control terminal of the current detection transistor. An operational amplifier is formed, that has the potential of the connection node between the current detection transistor and the current detection resistor applied to its inverse input terminal and a feedback loop, so as to make a pair of input terminals of the operational amplifier be at the same potential. A signal produced by the current detection resistor is thus outputted as a current detection signal.

13 Claims, 5 Drawing Sheets

FIG. 7(A) PWM

FIG. 7(B) Im

FIG. 7(C) Vsns

POWER SUPPLY DEVICE AND SWITCHING POWER SUPPLY DEVICE

This application is a continuation application of U.S. application Ser. No. 11/100,407, filed Apr. 7, 2005, now U.S. Pat. No 7,245,116 now allowed, the entirety of which is incorporated herein by reference.

CROSS-REFERENCE TO RELATED APPLICATION

The present application claims priority from Japanese patent application No. 2004-118541 filed on Apr. 14, 2004, the content of which is hereby incorporated by reference into this application.

BACKGROUND OF THE INVENTION

1. Field of the Invention

The present invention relates to a power supply device developing a DC voltage and to a technology effectively applied to the detection of current in a switching regulator, for example, to a power supply driver circuit for driving a power transistor constructing a switching power supply device that performs switching control by a PWM (pulse width modulation) control mode to convert an input voltage and outputs the voltage, and to a driver module incorporating the circuit, and to a technology effectively applied to the a switching power supply using the module.

2. Description of the Related Art

In recent years, microprocessors are mounted as system control devices in many electronic units. Further, there is a tendency for the operating frequency of a microprocessor (hereinafter referred to as "CPU") to become higher and higher and hence a maximum operating current also increases as the operating frequency increases. In many potable electronic units or the like incorporating a CPU, a system is adopted in which an operating current obtained by reducing a battery voltage by a switching regulator is supplied to a CPU. However, in recent years, a switching regulator capable of outputting a low voltage and a large current has been required as a switching regulator for such a microcomputer system.

Hence, a multi-phase power supply system is proposed in which a plurality of switching power supplies are connected in parallel to increase current supply capacity. In such a power supply system, it is necessary to detect a current passing through a coil and to feed back the driving signal of a power transistor of each power supply (phase) so as to pass an equal current through each phase. A technology for detecting a current so as to prevent an excess current passing through a coil has been known conventionally and does not involve high accuracy for detecting a current to prevent this excess current but involves comparatively high accuracy for detecting a current to perform feedback control.

Figure 1:
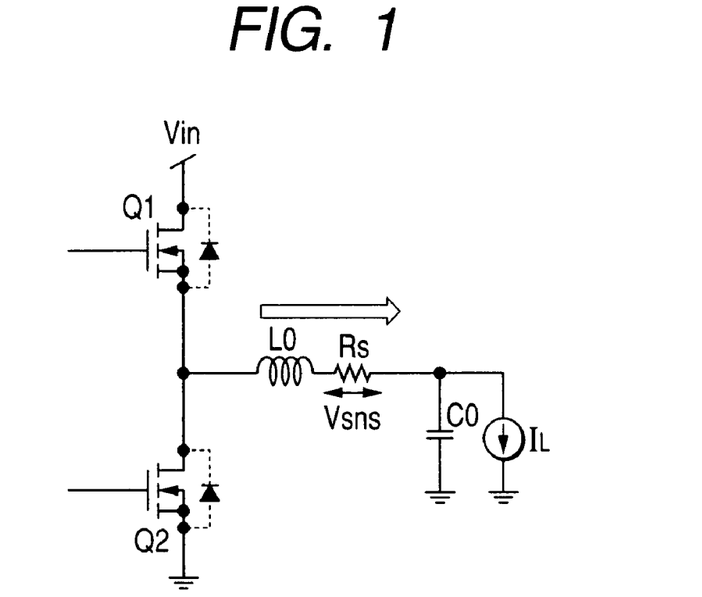
FIG. 1 is a circuit diagram showing one example of a current detection system in a switching regulator studied prior to making the invention.
Figure 2:
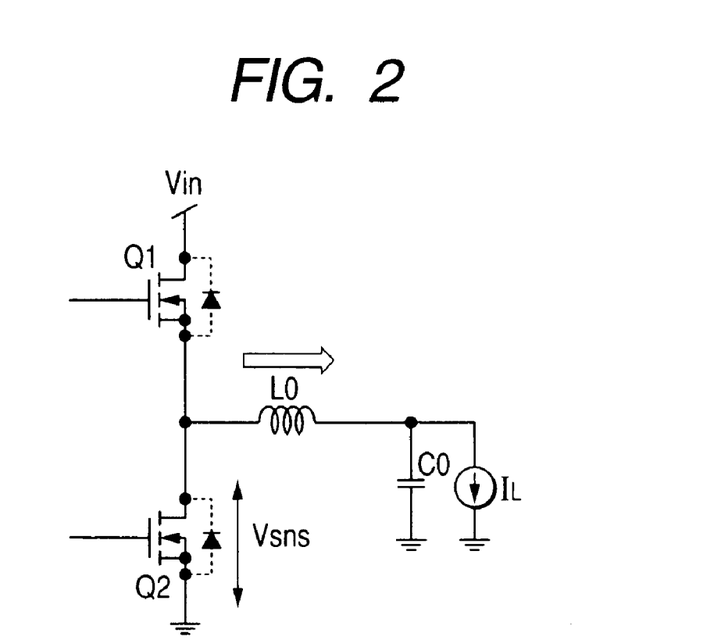
FIG. 2 is a circuit diagram showing another example of a current detection system in a switching regulator studied prior to making the invention.
Figure 3:
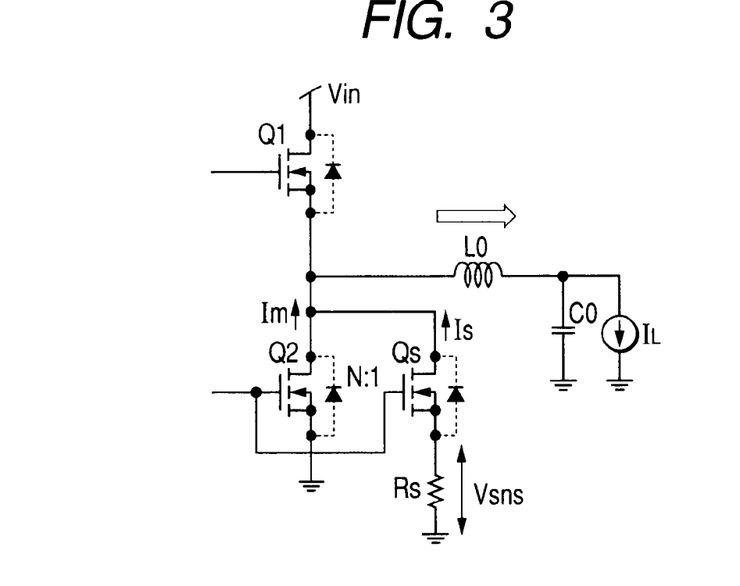
FIG. 3 is a circuit diagram showing still another example of a current detection system in a switching regulator studied prior to making the invention.

The following systems are thought as systems for detecting a current passing through a coil: for example, a system for detecting the voltage between the terminals of a current detection resistor connected in series to a coil, as shown in FIG. 1; a system for detecting the voltage between the source and the drain of a power MOS transistor in a system using a MOSFET as a power transistor passing a current through a coil, as shown in FIG. 2; and a system (hereinafter referred to as "sensing MOS transistor system") in which a current detection transistor connected in parallel to a power transistor is connected in series to a resistor and in which a current proportional to the current of the output power transistor is passed through the current detection transistor to detect the voltage between the terminals of the resistor, as shown in FIG. 3. Here, one of publicly known technologies for detecting a current passing through a power transistor by a sensing MOS transistor system is disclosed in, for example, patent document 1.

[Patent document 1] Japanese Unexamined Patent Publication No. 06-180332

The system using a current detection resistor connected in series to a coil, as shown in FIG. 1, presents a problem that power loss is considerably large because a current passing through the coil passes through the current detection resistor just as it is. Further, the system for detecting the voltage between the source and the drain of a power MOS transistor, as shown in FIG. 2, presents a problem that high detection accuracy can not be obtained because variations in the manufacture of a power MOS transistor and variations in detection value caused by temperature fluctuation are large. Still further, it is also thought to use a transistor having a small on resistance for the power MOS transistor in the regulator shown in FIG. 2. However, in this case, for example, when a rated current of 25 A is passed through a power MOS transistor having an on resistance of 2.5 m$\Omega$, the voltage Vd between its source and drain is only approximately 60 mV, which is hard to detect.

Still further, in the sensing MOS system as shown in FIG. 3, the drain voltage of the current detection MOS transistor is made higher by a voltage drop in the sensing resistor. Hence, if the voltage between the terminals of the sensing resistor is not sufficiently small as compared with the voltage Vd between the drain and the source of the power MOS transistor, the current detection MOS transistor and the power MOS transistor are different from each other in bias condition and hence a current proportional to a current passing through the power MOS transistor does not pass through the sensing MOS transistor, which results in reducing detection accuracy. For this reason, a resistor having a sufficiently small resistance needs to be used for the sensing resistor. Then, the voltage between the terminals of the resistor becomes small, which presents a problem that the detection of the voltage is difficult.

In this respect, the patent document 1 discloses a current detection circuit in which a current detection transistor is provided in parallel to an output transistor for passing a current through a coil and in which the source (emitter) voltage of the current detection transistor is made equal to the source (emitter) voltage of the output transistor by the use of an operational amplifier to pass a current of 1/N to be exact. However, the current detection circuit disclosed in the patent document 1 relates to the so-called series regulator that continuously controls the gate (base) voltage of an output transistor to develop a desired output voltage and is different in a target from the switching device of the present invention. Further, the current detection circuit is different also in a way of detecting voltage from the switching power supply device of the present invention. Still further, in the invention disclosed in the patent document 1, when the developed voltage Vout is low, the voltage Vsns developed between the terminals of the current detection resistor is small and hence is hard to detect. To be specific, when the voltage between the source and the drain of the MOS transistor is assumed to be Vds, Vsns=Vout−Vds. Hence, when the Vout is low, a sufficient detection voltage can not be developed.

SUMMARY OF THE INVENTION

One object of the invention is to provide a switching power supply device that causes a little power loss and has a high degree of efficiency and a power supply driver circuit and a module that are suitably applied to the device.

Another object of the invention is provide a switching power supply device that can detect a current passing through a coil with high accuracy and hence can control the current with high accuracy, even if the characteristics of an output power transistor is varied by variations in manufacture and temperature, and a power supply driver circuit and a module that are suitably applied to the device.

Still another object of the invention is a switching power supply device that can detect a current passing through a coil with high accuracy and hence can control the current with high accuracy, even if the on resistance of an output power transistor is small, and a power supply driver circuit and a module that are suitably applied to the device.

The above-described objects, the other objects, and the new features of the invention will become clear from the descriptions and the accompanying drawings of the invention.

The typical aspects of the invention disclosed in this application will be described in brief as follows.

That is, a power supply driver circuit constructing a switching power supply device that switches a power transistor passing a current through a coil as an inductance by a PWM mode to convert (boost or reduce) an input voltage and outputs the converted voltage is provided with: a current detection transistor that is connected to the power transistor at their drain terminals or collector terminals and has the same driving voltage as the power transistor applied to its control terminal; a current detection resistor that is connected to a source terminal or an emitter terminal of the current detection transistor; and an operational amplifier circuit that is connected to the connection node between the resistor and the current detection transistor at its one input terminal and has the voltage of the same potential as the source voltage or the emitter voltage of the power transistor applied to its other input terminal, and is constructed in such a way that a feedback loop is formed so as to make the pair of input terminals of the operational amplifier circuit be at the same potential and that a signal produced by the current detection resistor is outputted as a current detection signal.

To be more specific, in the power supply driver circuit, a current detection transistor, which is smaller in size than a low-potential side power transistor and is formed by the same process and has the same characteristics as the power transistor, and a current detection resistor are connected in parallel to the power transistor, and the same control voltage as the power transistor is applied to the control terminal of the current detection transistor. Further, in the power supply driver circuit, there are provided an operational amplifier having the potential of the connection node between the current detection transistor and the current detection resistor applied to its inverse input terminal and a bias transistor connected between another terminal of the current detection resistor and a power supply voltage terminal, and the output voltage of the operational amplifier is applied to the control terminal of the bias transistor and the same voltage as the source voltage or the emitter voltage of the power transistor is applied to the non-inverse input terminal of the operational amplifier and the source voltage or the emitter voltage of the bias transistor is applied to another terminal of the current detection resistor.

According to the means described above, the potential of the connection node between the current detection transistor and the current detection resistor is made the same potential as the source voltage or the emitter voltage of the power transistor by the imaginary short action of the operational amplifier. With this, even if a device having a small on resistance is used as a power transistor, the power transistor is made equal in the state of bias to the current detection transistor, whereby a current such that a current passing through the power transistor is exactly proportionally reduced can be passed through the current detection transistor and the loss of the power transistor can be reduced because the on resistance of the power transistor is small.

Further, even if the characteristic of the output power transistor is varied by variations in manufacture and temperature, the characteristic of the current detection transistor is also similarly varied. Hence, even when the power transistor and the current detection transistor are set at any size, both of them are not shifted in the state of bias and hence the resistance of the current detection resistor connected in series to the current detection transistor can be freely determined. As a result, it is possible to develop a sufficient detection voltage by the current detection resistor and to reduce power loss in the current detection resistor because the current detection resistor does not need to be connected in series to the coil.

Still further, another invention of this application is a driver module (power supply driver) constructing a switching power supply device that has a power transistor for passing a current through a coil as an inductance and a driver IC for driving the power transistor mounted on one insulating board and that switches the power transistor by a PWM mode to convert (boost or reduce) an input voltage and outputs the converted voltage. The driver module (power supply driver) uses a vertical type FET (field effect transistor) as the power transistor, includes a current detection transistor of a FET that is smaller in size than the power transistor and is formed at the same time on the same semiconductor chip and has the same characteristic as the power transistor, and has the drain electrode of the power transistor and the drain electrode of the current detection transistor provided as a common electrode on the back of the semiconductor chip.

According to the above-described means, the power transistor and the current detection transistor have the same characteristic. With this, it is possible to pass a current such that a current passing through the power transistor is reduced exactly proportionally to the size of the current detection transistor through the current detection transistor and hence to detect a current with higher accuracy. In addition, it is possible to easily apply a voltage to the source terminals of the power transistor and the current detection transistor and to downsize the semiconductor chip and the module.

The effects produced by the typical inventions disclosed in this application will be described in brief as follows.

That is, according to the invention, it is possible to realize a switching power supply device that causes a little power loss and has a high degree of efficiency, and a power supply driver circuit and a module that are suitably applied to the device.

Further, according to the invention, it is possible to realize a switching power supply device that has a high degree of accuracy in detecting a current passing through a coil and hence can control the current with high accuracy, even if the characteristics of an output power transistor is varied by variations in manufacture and temperature, and a power supply driver circuit and a module that are suitably applied to the device.

Still further, according to the invention, it is possible to realize a switching power supply device that can detect a current passing through a coil and hence can control the current with high accuracy, even if the on resistance of an output power transistor is small, and a power supply driver circuit and a module that are suitably applied to the device.

DETAILED DESCRIPTION OF THE PREFERRED EMBODIMENTS

Hereafter, the preferred embodiments of the invention will be described on the basis of the drawings.

Figure 4:
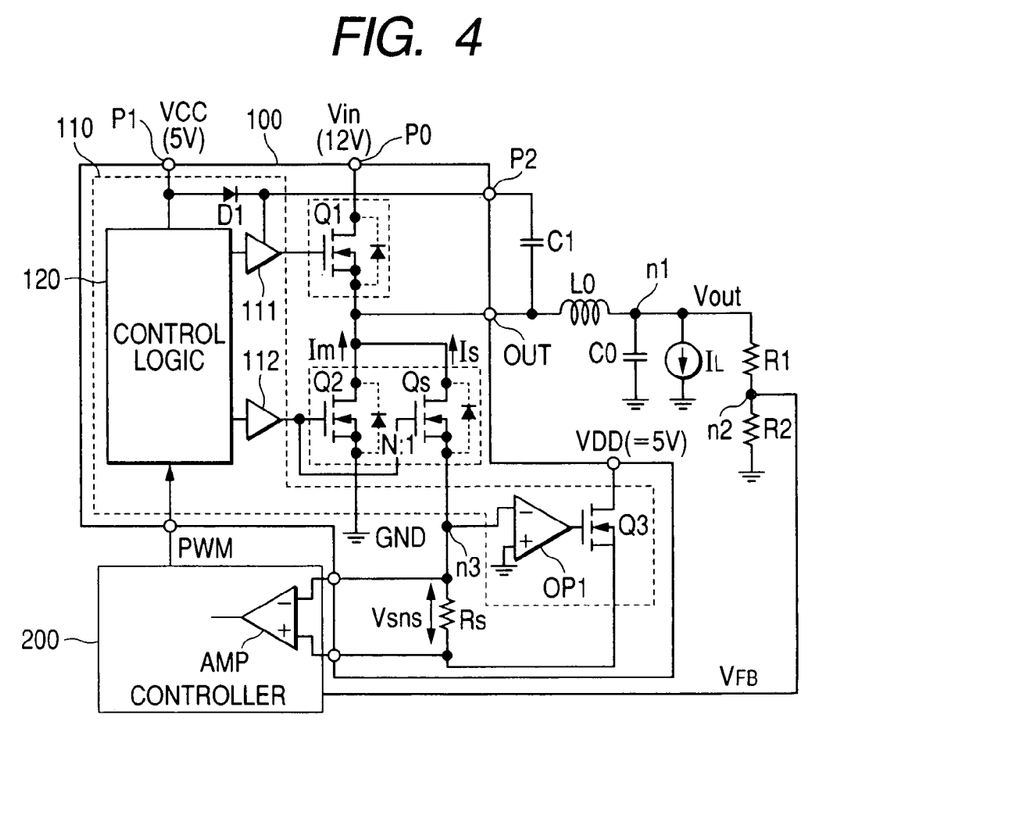
FIG. 4 is a circuit diagram showing one embodiment of a module incorporating a power supply driver circuit in accordance with the invention and a construction example of a step-down type switching regulator to which the module is applied.

FIG. 4 illustrates the first embodiment of a power supply driver module incorporating a power supply driver circuit in accordance with the present invention and a step-down type switching regulator using the same. Here, in this specification, a unit such that a plurality of semiconductor chips and discreet parts are mounted on an insulating board such as a ceramic board, on or in which printed wirings are provided, and are connected to each other by the printed wirings or bonding wires so that the respective parts play predetermined roles, and hence are so constructed as to be handled as one electronic part is referred to as a module. This power supply driver module is molded in a package such as ceramic to make a finished product, although it is not intended to limit the module to this.

A switching regulator shown in FIG. 4 is constructed of: a power supply driver module 100 incorporating a pair of power MOS transistors Q1 and Q2 connected in series between a voltage input terminal P0, to which a DC voltage Vin supplied from a DC power supply such as a battery is applied, and the ground (GND) and a driver IC 110 for driving the gate terminals of the transistors Q1 and Q2; a coil L0 that is connected between the output terminal OUT of the module 100 and a load and serves as an inductor; a smoothing capacitor C0 that is connected between a node n1 on the load side of the coil L0 and the ground (GND) and stabilizes an output voltage Vout; resistors R1 and R2 that are connected in series to each other and in parallel to the smoothing capacitor C0 and are used for detecting the output voltage; and a controller (PWM control circuit) 200 that produces a PWM control pulse PWM on the basis of the potential VFB of a connection node n2 connected to the resistors R1 and R2 and supplies it to the driver IC 110. In FIG. 4, it is a semiconductor integrated circuit as a load such as CPU that is supplied with and operated by a current from a switching regulator of this embodiment that is illustrated as a current source IL.

Further, in this embodiment, the switching regulator is constructed of: a current detection MOS transistor Qs (hereinafter referred to as "sensing transistor") that is connected in parallel to the power MOS transistor Q2 and has the same voltage as the gate driving voltage of the transistor Q2 applied to a gate terminal and a current detection resistor Rs (hereinafter referred to as "sensing resistor") that is connected in series to the transistor Qs; a bias MOS transistor Q3 that is connected between another end of the sensing resistor Rs and a power supply voltage VDD; and an operating amplifier OP1 the inverse input terminal of which is connected to the connection node n3 between the sensing transistor Qs and the sensing resistor Rs. The switching regulator is constructed in such a way that the voltage between both terminals of the sensing resistor Rs is applied to a differential amplifier AMP in the controller 200 to detect the voltage between the terminals of the sensing resistor Rs. Further, the non-inverse input terminal of the operating amplifier OP1 is connected to the ground GND and the output of the operating amplifier OP1 is applied to the gate terminal of the bias MOS transistor Q3.

With this, the potential of source terminal of the current detection transistor Qs is made equal to the potential (grounding potential GND in this embodiment) applied to the source terminal of the power MOS transistor Q2 by the imaginary short action of the operating amplifier OP1. Further, the power MOS transistor Q2 and the sensing transistor Qs are formed on the same semiconductor chip by the same process in such a way that the ratio of a device size (gate width) is a predetermined ratio (N:1) and the same voltage as the gate driving voltage of the transistor Q2 is applied to the gate terminal of the transistor Qs.

Figure 6A:
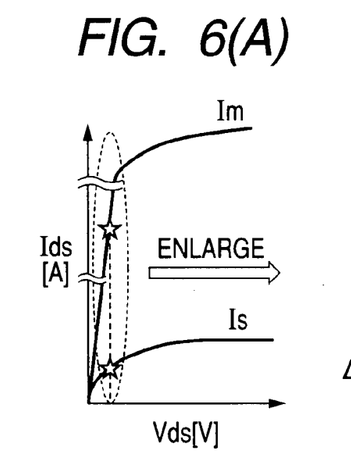
FIG. 6 is a characteristic diagram showing the relationship between the drain current passing through a low-side power transistor and a sensing transistor and voltage between a drain and a source in the power supply driver module in accordance with the invention.
Figure 6B:
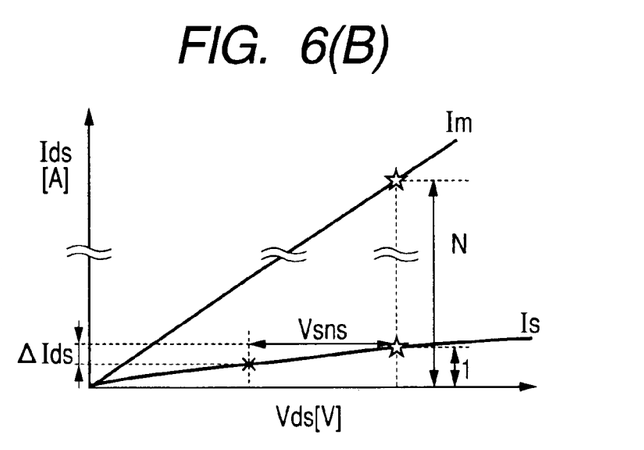

As a result, the power MOS transistor Q2 and the current detection transistor Qs are made equal to each other in the state of bias and, as shown by a reference symbol XXX in FIG. 6B showing the unsaturated region of Vds—Ids characteristics of the transistors Q2, Qs in enlargement, whereby a drain current Is (=Im/N) such that the drain current Im of the power MOS transistor Q2 is reduced exactly proportionally to 1/N passes through the current detection transistor Qs. Further, even if the on resistance of the power MOS transistor Q2 is varied by variations in manufacture or temperature to vary the drain current, the characteristic of the sensing transistor Qs is also varied in the same way as that of the transistor Q2, whereby the current passing through the transistor Qs is varied in the same way as the current passing through the transistor Q2, so that the current can be detected with high accuracy.

Here, if it is assumed that the voltage between the terminals of the sensing resistor Rs is Vsns, the voltage Vsns can be expressed by the following equation using the drain current Im of the transistor Q2, the size ratio N between the transistors Q2 and Qs, and the resistance rs of the sensing resistor Rs;

$$Vsns=Is\times rs=(Im/N)\times rs$$

Figure 5:
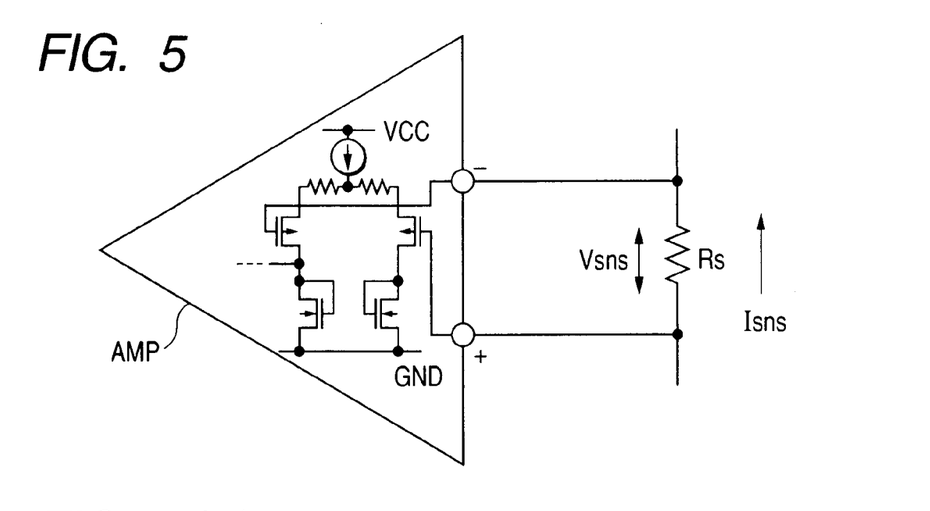
FIG. 5 is a circuit diagram showing a construction example of a current detection differential amplifier provided on a controller side in the regulator in FIG. 4.

Further, when a CMOS differential amplifier having a high input impedance, as shown in FIG. 5, is used as a differential amplifier provided in the controller 200, current Is passing through the sensing transistor Qs becomes equal to current passing through the sensing resistor Rs because current does not pass through the differential amplifier. Hence, the drain current Im of the power MOS transistor Q2 can be detected with high accuracy from the voltage Vsns between the terminals of the sensing resistor Rs.

In contrast to this, when a detection system shown in FIG. 3 is used, the power MOS transistor Q2 and the sensing transistor Qs are different from each other in the drain voltage by a voltage drop Vsns in the sensing resistor Rs, so that the voltage Vds between the drain and source of the sensing transistor Qs is made smaller than the Vds of the transistor Q2 by the voltage drop Vsns. Hence, as shown by a reference symbol X in FIG. 6B, a drain current smaller than Im×1/N by ΔIds passes through the transistor Qs to cause an error also in the detection voltage Vsns. Therefore, the application of this embodiment provides an advantage of increasing detection accuracy as compared with the detection system shown in FIG. 3.

In this embodiment, N is arbitrarily selected within a range of 100 to 10000, although it is not intended to limit the range to this. With this, Vsns ranging from 0.1 V to 1V can be obtained. In a system for measuring the voltage between the source and drain of the power MOS transistor shown in FIG. 2, when the on resistance of the power MOS transistor is 2.5 mΩ, the voltage Vds between the drain and the source is approximately only 60 mV and hence is hard to detect. However, when this embodiment is applied, a detection voltage of an order of magnitude higher than the voltage Vds can be produced and hence is easy to detect. Although a voltage VDD on the drain side of the bias transistor Q3 is 5 V in this embodiment, it is essential only that the voltage VDD is Vsns+√(2Is/β) or more, where β is a constant determined by the gate width, gate length, and gate oxide film thickness of the bias transistor Q3.

Further, when the input voltage Vin of the module is 12 V and the output voltage of the regulator is set at 1.2 V, as is the case with the regulator of this embodiment, the duty of PWM control pulse is approximately 10%, so that the time is elongated during which the power MOS transistor Q2 on the grounding potential GND side (hereinafter referred to as "low side") is on. For this reason, it is important to reduce loss in the power MOS transistor Q2 on the low side as compared with the power MOS transistor Q1 on the input voltage Vin side (hereinafter referred to as "high side").

In this embodiment, a transistor whose on resistance is as very small as 2.5 mΩ is used as the power MOS transistor Q2 on the low side, so that power loss can be reduced. In addition, when the power MOS transistor having such a small on resistance is used, even when a rated current is 25 A, the voltage between the drain and the source is only approximately 60 mV and hence is hard to detect. However, in this embodiment, the sensing transistor Qs for passing current proportional to the power MOS transistor Q2 is provided and the sensing resistance Rs is set at a suitable resistance, so that the voltage can be easily detected.

Further, the application of this embodiment can reduce power consumption heavily as compared with a detection system, shown in FIG. 1, using a sensing resistor connected in series to a coil. To be more specific, in the detection system shown in FIG. 1, if it is assumed that current IL passing through the coil L0=25 A and the resistance rs of the sensing resistor Rs=10 mΩ, detection voltage Vsns=IL×rs=250 mΩ and the power consumption W of the sensing resistor=Vsns×IL=IL²×rs=6.25 W.

In contrast to this, in the regulator of this embodiment, if it is assumed that N=1000 and Rs=10 Ω, when the same current of 25 A is passed through the coil to produce the same detection voltage Vsns of 250 mV, only a current of 1/N times 25 A (=0.025 A) passes through the sensing resistor Rs and hence the power consumption W of the sensing resistor=IL²×rs=(0.025)²×10=0.000625 W. On the other hand, power consumption of the additional operating amplifier OP1 and the bias transistor Q3 is approximately 0.1 W according to the result of inventors' trial calculation. Hence, the total power consumption obtained by adding the power consumption of the sensing resistor Rs to the power consumption of the operating amplifier OP1 and the bias transistor Q3 is approximately 0.1 W and hence is considerably small as compared with the power consumption of the detection system shown in FIG. 1.

Further, in the invention as described in patent document 1, the voltage Vsns between the terminals of a current detection resistor=Vout−Vds, so that when the developed voltage Vout is low, Vsns becomes small and hence is hard to detect. However, in this embodiment, the voltage between the terminals of the sensing resistor Rs does not depend on the voltage between the drain and the source of the MOS transistor Q3 and the power supply voltage VDD on the drain side of the MOS transistor Q3 can be set irrespectively of the output voltage Vout, so that the detection of Vsns is not difficult.

In this embodiment, the power MOS transistors Q1 and Q2 are formed as devices separate from the driver IC 110 (discrete parts) and are mounted on the same insulating board together with the driver IC 110 to construct the power supply driver module 100. Further, N channel type MOSFETs (field effect transistor) are used for the power MOS transistors Q1 and Q2. This is because the N channel type MOSFET can operate at higher speeds than a P channel type MOSFET.

The driver IC 110 is constructed of: a gate driving circuit 111 for developing the gate driving voltage of the power MOS transistor Q1 on the high side; a gate driving circuit 112 for developing the gate driving voltage of the power MOS transistor Q2 on the low side; and a control logic 120 for producing the input signal to the gate driving circuits 111 and 112 in such a way that the power MOS transistors Q1 and Q2 are complementarily turned on/off with a dead time on the basis of a PWM control pulse PWM from the controller 200 so as to prevent that the power MOS transistors Q1 and Q2 are brought to on state at the same time to have a through current passed therethrough. The operating amplifier OP1 can be provided in the driver IC 110.

In this embodiment, the driver IC 110 is provided with an external power supply terminal P1 for applying a power supply voltage VCC and a diode D1 is connected between the power supply terminal P1 and the power supply terminal of the gate driving circuit 111 developing the gate driving voltage of the power MOS transistor Q1 on the high side and an external terminal P2 is connected to the cathode terminal of the diode D1 (power supply terminal of the gate driving circuit 111) and a capacitor C1 is connected between the external terminal P2 and the output terminal OUT of the module. In this manner, a bootstrap circuit is constructed in which the diode D1 and the capacitor C1 boost the power supply voltage of the gate driving circuit 111.

The power MOS transistor Q1 on the high side and the power MOS transistor Qs on the low side are complementarily turned on/off by the driving circuits 111 and 112 according to the pulse width of the input PWM control pulse PWM to pass current through the coil L0 to output a voltage Vout responsive to the duty ratio of the PWM control pulse.

Further, in the switching regulator of this embodiment, gate control signals to be inputted to the gate driving circuits 111 and 112 are produced by the control logic 120 in the driver IC 110 on the basis of the PWM control pulse PWM supplied from the controller 200. At this time, when the periods during which the gate control signal is at a high level overlap each other because the delay time of the gate control signal varies, a through current passes through the power MOS transistors Q1 and Q2. Hence, to avoid this, in the control logic 120, the gate control signals to be inputted to the gate driving circuits 111 and 112 are produced so as to prevent the periods during which the gate control signal to the power MOS transistors Q1 and Q2 is at a high level from overlapping each other.

Figure 7A:
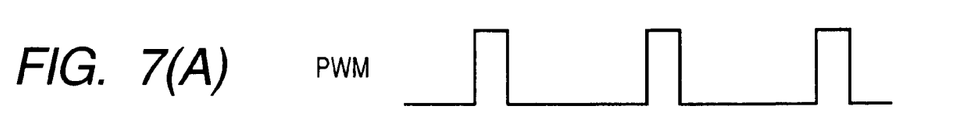
FIG. 7 is a timing chart showing a PWM control pulse, a current passing through the low-side power MOS transistor, and a change in detection voltage produced by a sensing resistor in the regulator shown in FIG. 4.
Figure 7B:
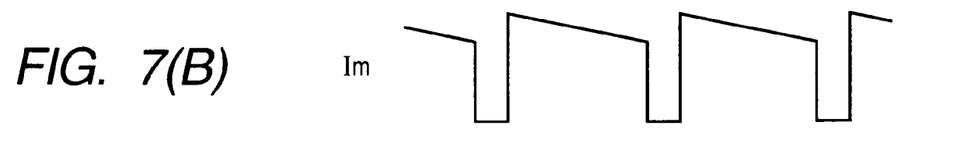
Figure 7C:
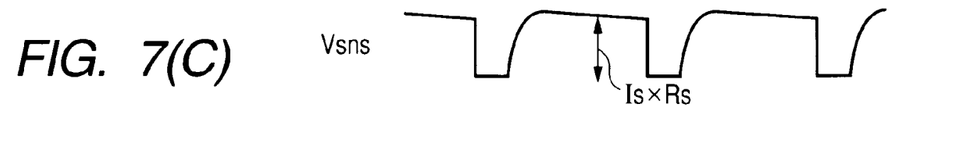

In FIG. 7 are shown voltage waveforms at respective points in the switching regulator to which the module of this embodiment is applied. In FIG. 7, A shows the PWM control pulse PWM supplied to the driver IC 110 from the controller 200, B shows current passing through the power MOS transistor Q2 on the low side, and C shows voltage developed between the terminals of the sensing resistor Rs. This voltage shown by C is supplied as the detection voltage Vsns to the differential amplifier AMP in the controller 200. It is because the response characteristics of the operating amplifier OP1 that the detection voltage Vsns rises gradually.

When the controller 200 samples the output of the differential amplifier AMP not in the period during which the PWM control pulse PWM is at a high level or in the period during which the waveform of Vsns rises gradually but near the center of the period during which the PWM control pulse PWM is at a low level, a correct detection voltage can be obtained. Since the PWM control pulse PWM is a signal produced by the controller 200, the controller 200 can easily know an optimal sampling timing.

Figure 8:
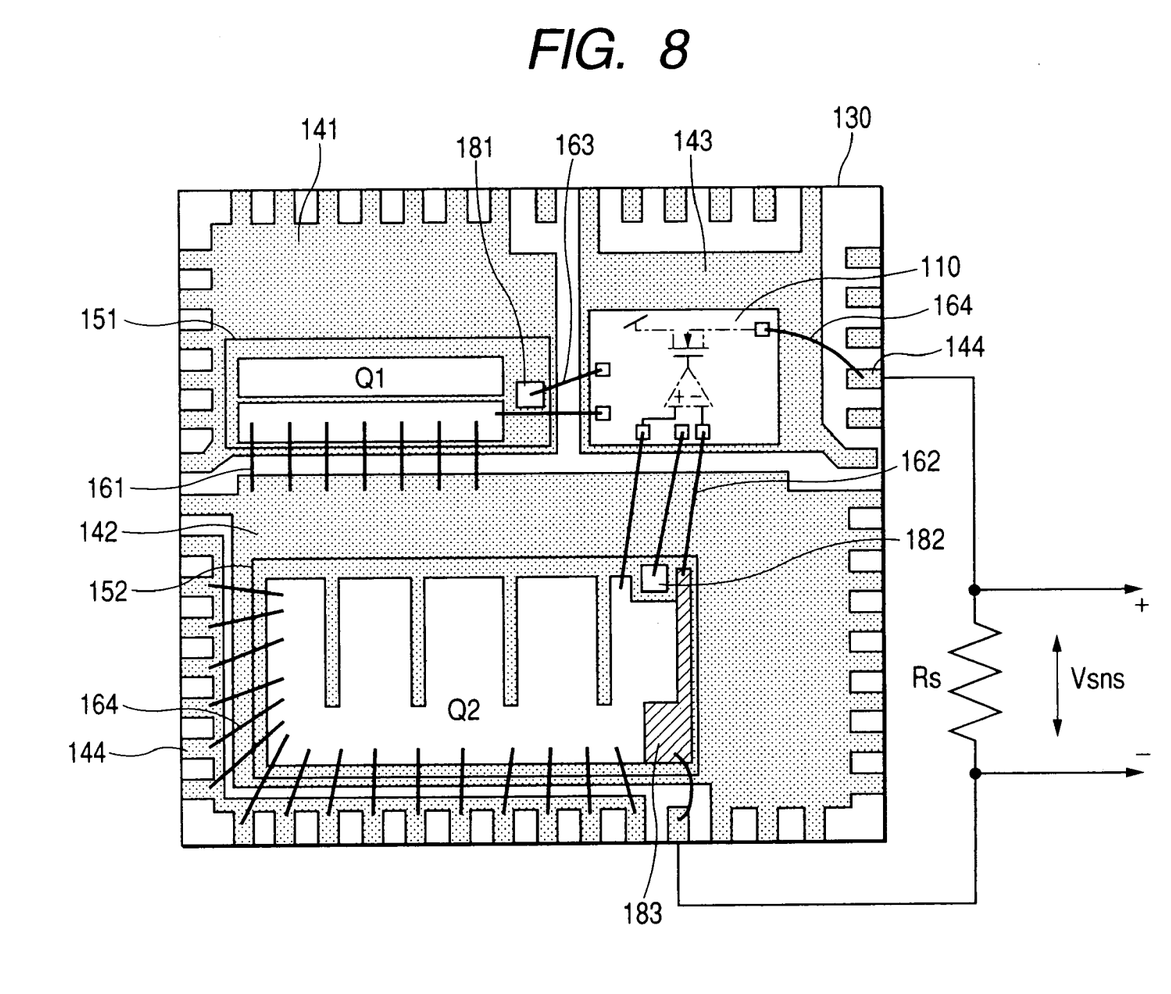
FIG. 8 is a plan view showing a specific construction of a power supply driver module in accordance with the invention.

FIG. 8 shows a specific construction example of the driver module 100 incorporating the power supply driver IC 110 of the embodiment shown in FIG. 4. In FIG. 8, a reference symbol 130 is a module board made of an insulating board such as ceramic board. Further, hatched parts 141, 142, 143 are electrode patterns that are formed of a conducting layer made of aluminum or the like on the surface of the module board 130.

In this embodiment, a semiconductor chip 151 having the high-side power MOS transistor Q1 formed therein is mounted on the electrode pattern 141, and a semiconductor chip 152 having the low-side power MOS transistor Q2 formed therein is mounted on the electrode pattern 142, and the driver IC chip 110 is mounted on the electrode pattern 143, and the respective chips are electrically connected to each other by bonding wires 161 to 163. Further, electrodes 144 as external terminals are formed on the respective sides of the module board 130 and are electrically connected to the bonding pads and electrodes of the corresponding chips by the bonding wires 164. It is for the purpose of reducing the resistance of the terminal and bonding wire that a plurality of bonded electrodes at some portions and wires bonded at one end to the same electrodes are provided. Further, it is for the purpose of making the on resistance of the low-side power MOS transistor Q2 smaller than the on resistance of the high-side power MOS transistor Q1 that the chip 152 is larger than the chip 151.

In this embodiment, as described above, the low-side power MOS transistor Q2 and the sensing transistor Qs are formed in the same semiconductor chip 152. In addition, these transistors Q2, Qs are constructed of vertical type FETs and their drain electrodes are common to each other on the back of the chip and are bonded to the electrode pattern 142 on the module board. With this, grounding potential supplied by the external terminal via the electrode pattern 142 is applied to these transistors Q2, Qs.

To be more specific, several hundred thousand to several million FETs are formed in the semiconductor chip 152 and 1/N FETs of them are used as sensing transistors Qs and remaining FETs are commonly connected to each other at their source electrodes, thereby operating as one power transistor Q2. This eliminates the need for designing the separate patterns of the source regions and the gate electrodes and hence can facilitate designing and makes it possible to easily determine the ratio of current, that is, the ratio of size N by the ratio of area corresponding to the number of transistors. It is also recommended that the drain electrodes of the transistors Q2 and Qs be formed separately in place of making them the common electrode and be bonded to the electrode pattern 142 on the module board, whereby the same voltage is applied to the transistors Q2 and Qs.

In this regard, in FIG. 8, a reference numeral 181 denotes the gate pickup electrode of the power transistor Q1, 182 denotes the common gate pickup electrode of the power transistor Q2 and the sensing transistor Qs, and 183 denotes the source electrode of the sensing transistor Qs. Although it is not intended to limit the driver IC 110 to the following construction, the driver IC 110 is constructed of a CMOS circuit and a MOS transistor having an especially high voltage applied thereto is constructed of a LDMOS (Laterally Diffused MOSFET) in which terminals are diffused in a lateral direction on a semiconductor chip to increase resistance to high voltage.

In this embodiment, the sensing resistor Rs is connected as an external device of a power supply driver module 100 to the external terminal of the module board. However, it is also recommended that the sensing resistor Rs be built in the module, that is, be mounted on the module board 130 along with the semiconductor chips 110, 151, 152 and be covered with ceramic, thereby being sealed in a package made of the module board. However, the use of the outboard device as described in this embodiment can provide an advantage of selecting an optimal sensing resistor according to the specification and the like of the controller 200 to be combined.

Figure 9:
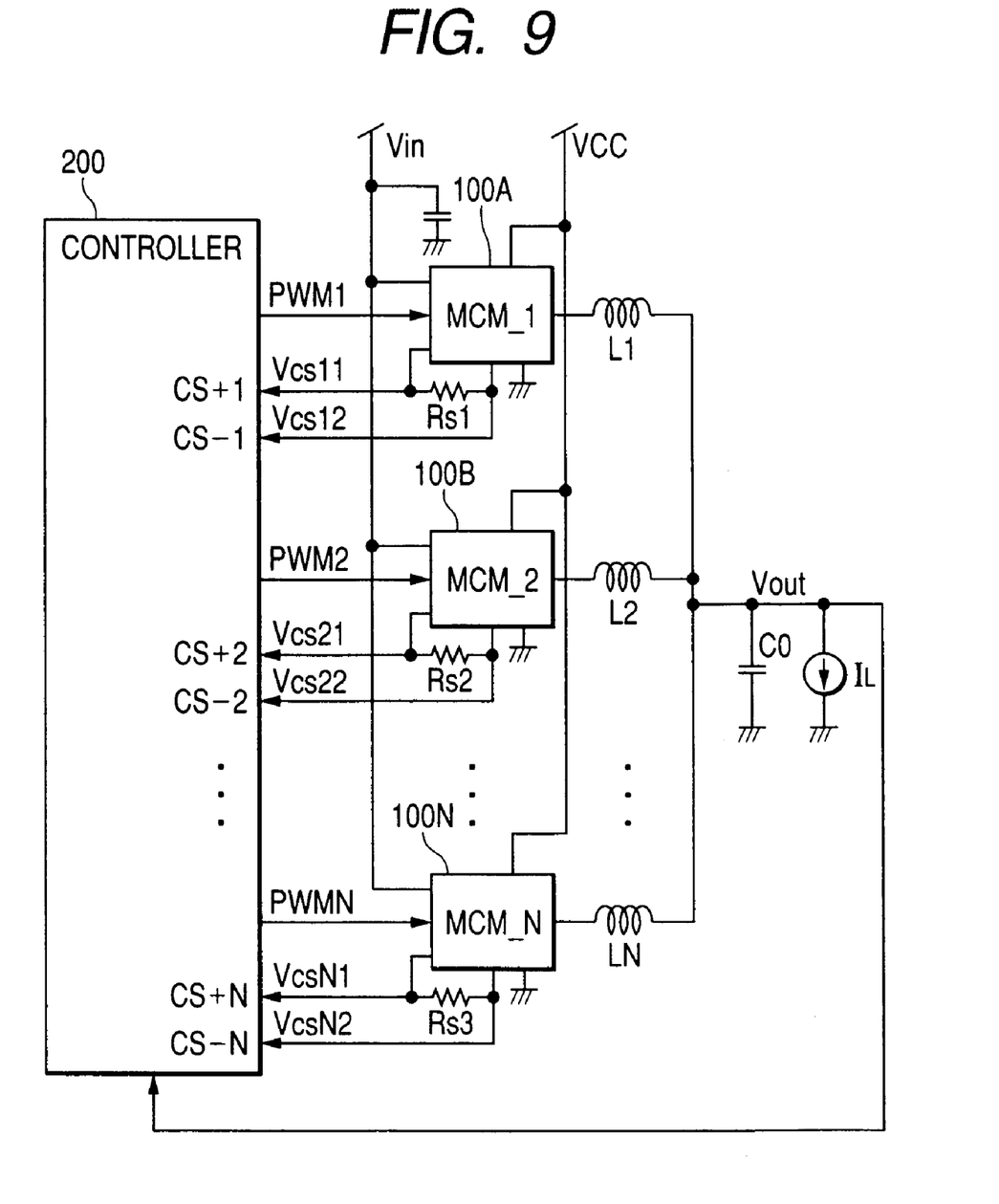
FIG. 9 is a block diagram showing a construction example of a multi-phase system as a power supply system using a plurality of power supply driver modules in accordance with the invention.

FIG. 9 shows a construction example of a multi-phase system as a power supply system using a plurality of power supply driver modules in accordance with the invention.

The power supply system in FIG. 9 is a system suitable for a load that needs a current large than the current supply capacity of one switching regulator. In FIG. 9, parts denoted by reference symbols 100A, 100B, . . . 100N are power supply driver modules each incorporating a power MOS transistor having the construction shown in FIGS. 4 and 8 and a plurality of power supply driver modules are driven and controlled on the basis of the PWM control pulse PWM by one controller 200. The respective power supply driver modules 100A, 100B, . . . 100N are provided with external current sensing resistors Rs1, Rs2, . . . RsN, respectively, and the voltages VCS11, VCs12; VCS21, VCS22; . . . ; VCSN1, VCSN2 of the terminals of these current sensing resistors Rs1, Rs2, . . . RsN are fed back to the controller 200 and the output voltage Vout is also fed back to the controller 200. The voltage to be fed back may be the voltage divided by resistors R1, R2 provided between the output terminal and ground as shown in FIG. 4.

The controller 200 determines the duty of a PWM control pulse as the entire system on the basis of the fed-back output voltage Vout so as to make the fed-back output voltage Vout a target voltage and produces the individual PWM control pulse PWM1, PWM2, . . . , PWMN of the respective power supply driver modules 100A to 100N so as to make currents passing through the respective coils L1, L2, . . . , LN equal to each other according to the voltages VCS11, VCs12; VCS21, VCS22; . . . ; VCSN1, VCSN2 of the terminals of these current sensing resistors Rs1, Rs2, . . . RsN and performs the PWM control. With this, it is possible to avoid some of coils from being broken or degraded in characteristics by excessive current passing through the coils.

While the invention made by the present inventor has been described specifically on the basis of the embodiments, needless to say, the invention is not limited to the embodiments described above but can be variously modified within the scope of the invention. For example, the differential amplifier constructed of the MOS transistor has been described as the differential amplifier AMP in the controller 200 in the embodiments, but a differential amplifier constructed of a bipolar transistor may be used. Further, in the embodiments, the power supply modules have been described in which MOSFETs are used as the power transistors Q1, Q2 and the current sensing transistor Qs, but these transistors can be constructed of bipolar transistors.

Further, while it has been described in the embodiments that the differential amplifier AMP for amplifying the voltage between the terminals of the current detection resistor Rs is provided in the controller 200, it is also recommended that this differential amplifier AMP be provided in the driver IC 110 to supply a current detection value to the controller 200 from the driver IC 110. Further, already-available controllers for power supply control include a controller of the type in which a detection value is inputted not as voltage but as current and, in the driver IC (see FIG. 4) of this embodiment, it is possible to input a detection value as a current value by connecting one terminal of the current detection resistor Rs to the input terminal of a current detection type controller via a resistor.

The step-down type switching regulator has been described above that uses the invention made by the present inventor as the power supply device of an electronic device of one application of its background. However, the invention can be widely applied to a step-up type switching regulator and the like.

What is claimed is:

1. A power supply driver circuit including a switching power supply device that switches a power transistor passing a current through an inductance by a PWM mode to convert an input voltage and outputs the converted voltage, the circuit comprising:
    a current detection transistor that has a drain terminal or a collector terminal, a source terminal or an emitter terminal, and a control terminal, wherein a drain terminal or a collector terminal of the power transistor is coupled to the drain terminal or the collector terminal of the current detection transistor, and the control terminal of the current detection transistor is coupled to receive a driving voltage which is received by a control terminal of the power transistor;
    a current detection resistor that is coupled to the source terminal or the emitter terminal of the current detection transistor; and
    an operational amplifier circuit that has a pair of input terminals, one of the pair of input terminals being coupled to a connection node of the current detection resistor and the current detection transistor and the other of the pair of input terminals being applied with a voltage of same potential as a source voltage or an emitter voltage of the power transistor,
    wherein the power transistor and the current detection transistor are formed on a first semiconductor chip, and the operational amplifier circuit is formed on a second semiconductor chip,
    the first and second semiconductor chips are mounted on an insulating board and are electrically connected to each other by bonding wires,
    a feedback loop is formed so as to make the pair of input terminals of the operational amplifier circuit be at a same potential, and
    a signal produced by the current detection resistor is outputted as a current detection signal.

2. The power supply driver circuit as claimed in claim 1, wherein the power transistor includes two power transistors coupled in series between first and second power supply voltage terminals, and
    wherein the current detection transistor is coupled to one of the two power transistor, which is coupled to the power supply voltage terminal on a low potential side.

3. The power supply driver circuit as claimed in claim 2, further comprising:
    a bias transistor coupled between another terminal of the current detection resistor and a third power supply voltage terminal,
    wherein an output voltage of the operational amplifier circuit is applied to a control terminal of the bias transistor.

4. The power supply driver circuit as claimed in claim 1, wherein the power transistor and the current detection transistor are formed on a same semiconductor chip by a same process and have same characteristics.

5. The power supply driver circuit as claimed in claim 1, wherein the power supply driver circuit and the power transistor switched by the power supply driver circuit are mounted on one insulating board.

6. The power supply driver circuit as claimed in claim 5, further comprising:
    an external terminal to which the current detection resistor can be coupled as an external device.

7. The power supply driver circuit as claimed in claim 1, wherein the power transistor and the current detection transistor are formed on a semiconductor chip as vertical type devices, and
    wherein drain electrodes or collector electrodes of the power transistor and the current detection transistor are formed as common electrodes in a conducting layer formed over a surface of the semiconductor chip.

8. The power supply driver circuit as claimed in claim 1, wherein a driving circuit for developing a driving voltage of the power transistor and the operational amplifier circuit are formed on one semiconductor chip.

9. The power supply driver circuit as claimed in claim 2, wherein a final output stage of a first gate driving circuit is so constructed as to be operated by a voltage boosted by a potential of a connection node of the two power transistors to which the inductance is connected.

10. A switching power supply device comprising:
the power supply driver circuit as claimed in claim 1;
an inductance coupled to the power supply driver circuit;
a smoothing capacitor for storing a current passed through the inductance; and
a controller for producing and supplying a PWM control pulse to be supplied to the power supply driver circuit according to a voltage developed by the smoothing capacitor,
wherein a signal produced by the current detection resistor is supplied as a current detection signal to a detection input terminal of the controller.

11. The switching power supply device as claimed in claim 10, wherein the detection input terminal is a terminal not to be coupled to a DC power supply voltage.

12. The switching power supply device as claimed in claim 10, wherein the controller has a differential amplifier circuit coupled to the detection input terminal.

13. A switching power supply device comprising:
a plurality of power supply driver circuits as claimed in claim 1;
a plurality of inductances connected to the power supply circuits; and
one controller for producing and supplying a PWM control pulse to be supplied to each of the power supply driver circuits,
wherein current detection signals produced by the plurality of power supply driver circuits are supplied to the one controller.

* * * * *